(12) United States Patent
Edahiro et al.

(10) Patent No.: US 7,692,987 B2
(45) Date of Patent: Apr. 6, 2010

(54) SEMICONDUCTOR STORAGE DEVICE

(75) Inventors: Toshiaki Edahiro, Yokohama (JP);
Masahiro Yoshihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 18 days.

(21) Appl. No.: 12/123,791

(22) Filed: May 20, 2008

(65) Prior Publication Data
US 2008/0291743 A1 Nov. 27, 2008

(30) Foreign Application Priority Data
May 21, 2007 (JP) ............................. 2007-133839

(51) Int. Cl.
*G11C 7/00* (2006.01)
(52) U.S. Cl. .................. 365/203; 365/185.25
(58) Field of Classification Search ................. 365/203, 365/185.25, 189.05
See application file for complete search history.

(56) References Cited
U.S. PATENT DOCUMENTS 5,848,015 A * 12/1998 Seno .......................... 365/203
6,490,212 B1 * 12/2002 Nguyen et al. ............... 365/207
7,046,568 B2    5/2006 Cernea
7,369,450 B2 *  5/2008 Choy .......................... 365/205
7,542,352 B1 *  6/2009 Kuo ....................... 365/185.25
2009/0161436 A1 6/2009 Abiko et al.

FOREIGN PATENT DOCUMENTS

JP    2001-325796    11/2001
JP    2004-326864    11/2004

* cited by examiner

*Primary Examiner*—Anh Phung
(74) *Attorney, Agent, or Firm*—Oblon, Spivak, McClelland, Maier & Neustadt, L.L.P.

(57) ABSTRACT

This disclosure concerns a semiconductor storage device including a bit line; a first capacitor supplying a charge to a cell; a first sense node transmitting a potential corresponding to data of the cell; a first pre-charge part charging the bit line, the first capacitor, and the first sense node; a first latch part latching the data; a first sense part including a first sense transistor connected between a power supply and the first latch part, the gate is connected to the first sense node; and a first clamp part connecting a first node between the first latch part and the first sense transistor to the bit line, wherein the first capacitor supplies the charge to the bit line during detecting, and the first sense part supplies a charge from the power supply to the bit line via the first clamp part in response a potential at the first sense node.

19 Claims, 10 Drawing Sheets

SEMICONDUCTOR STORAGE DEVICE

CROSS-REFERENCE TO RELATED APPLICATION

This application is based upon and claims the benefit of priority from the prior Japanese Patent Applications No. 2007-133839, filed on May 21, 2007, the entire contents of which are incorporated herein by reference.

BACKGROUND OF THE INVENTION

1. Field of the Invention

The present invention relates to semiconductor storage devices, for example, relates to a sense circuit used in a NAND type flash memory.

2. Related Art

In recent years, there has been expanding interest in the application of treating high capacity data such as images and moving pictures by mobile equipment. With the expansion, demands for semiconductor storage devices such as a NAND type flash memory used in mobile equipment have been rapidly increasing. Since the NAND type memory adopts a NAND string structure to which memory cells are connected in series, it is excellent in miniaturization; however, a cell current flowing through the memory cells is relatively small. Therefore, a sense amplifier of the NAND type flash memory needs to accurately detect a small cell current.

The sense amplifier is provided with a capacitor which is connected to a sense node and a precharge circuit which charges a bit line. The precharge circuit serves to preliminarily charge the bit line and the capacitor before data detection, and to hold a bit line potential.

For example, when a selected memory cell connected to the bit line allows a relatively large current (cell current) into the selected memory cell, that is, when the selected memory cell is a memory cell in ON state (hereinafter, also referred to as "ON cell"); first, the capacitor connected to the sense node supplies a charge to the bit line during the data detection. When the charge accumulated in the capacitor reduces, a potential at the sense node reduces. When the potential at the sense node is lowered to a predetermined potential, a precharge circuit supplies the charge to the bit line in place of the capacitor. At this time, if the potential at the sense node does not sufficiently reduce, the sense amplifier is not normally operated; and consequently, there is a case where the memory cell cannot recognize the ON cell.

The precharge circuit is connected to bit line via a plurality of transistors. The potential at the sense node during supplying the charge by the precharge circuit is determined in response to a gate voltage of their transistors. Therefore, in order to lower the potential at the sense node, it is conceivable to lower the gate voltage of the transistors provided between the precharge circuit and the bit line. However, a bit line potential during the data detection is also determined by the gate voltage of these transistors. Consequently, to lower the gate voltage of these transistors makes the cell current lower by lowering of the bit line potential. This lowering of the cell current leads to an increase in data detection time.

SUMMARY OF THE INVENTION

A semiconductor storage device according to an embodiment of the present invention comprises a memory cell which stores data; a bit line connected to the memory cell; a first capacitor which supplies a charge to the memory cell; a first sense node thorough which a potential corresponding to data of the memory cell is transmitted; a first pre-charge part which is for charging the bit line, the first capacitor, and the first sense node; a first latch part which latches the data of the memory cell; a first sense part which includes a first sense transistor whose gate is connected to the first sense node, one of a source or a drain is connected to a power supply, and the other of them is connected to the first latch part; and a first clamp part which allows a first node between the first latch part and the first sense transistor to be connected to the bit line, wherein the first capacitor supplies the charge to the bit line during detecting the data of the memory cell, and the first sense part supplies a charge from the power supply to the bit line via the first clamp part in response a potential at the first sense node.

DETAILED DESCRIPTION OF THE INVENTION

Embodiments according to the present invention will be described below with reference to accompanying drawings. The present embodiments are not limited to the present invention.

First Embodiment

Figure 1:
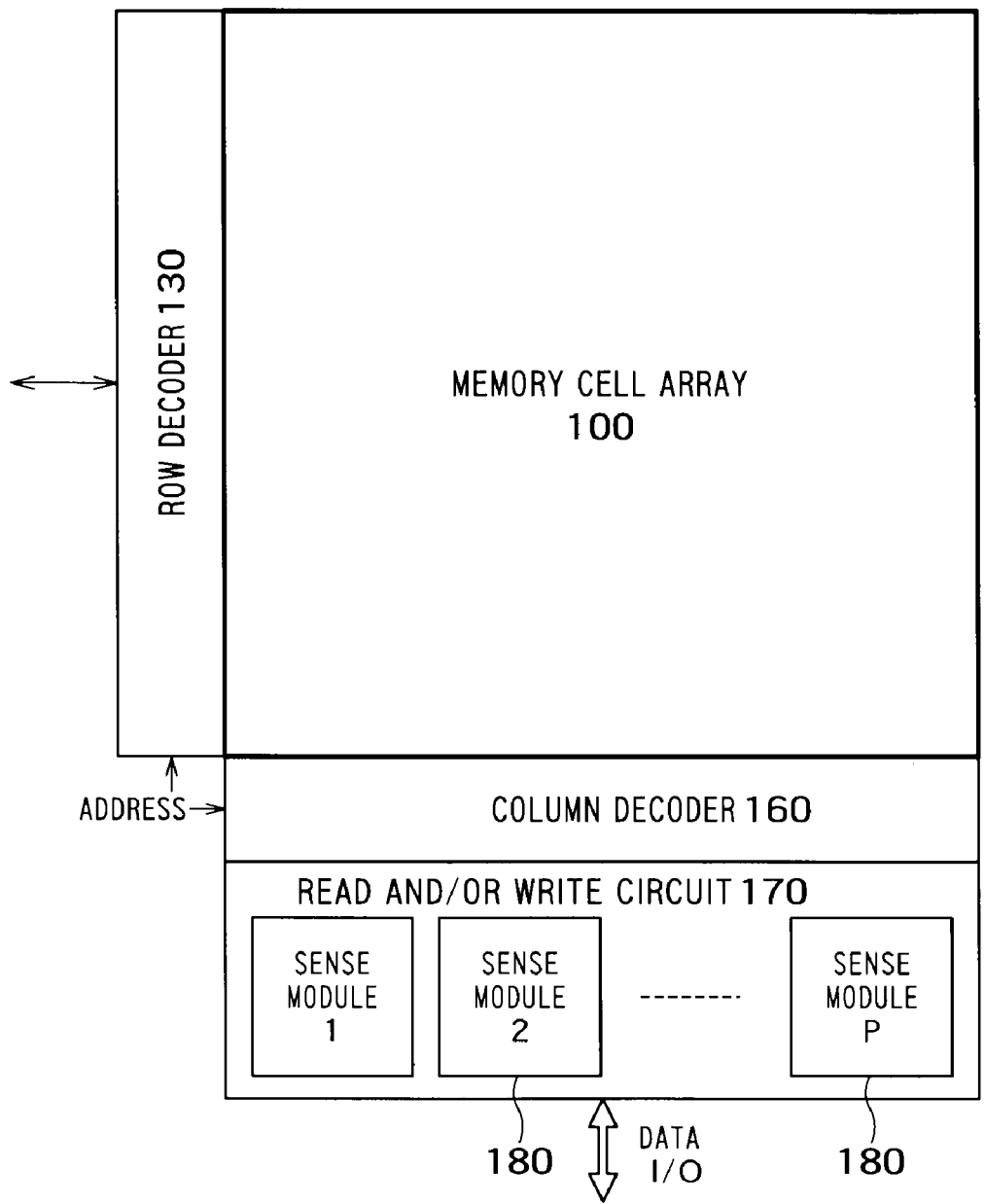
FIG. 1 is a block diagram showing a configuration of a semiconductor storage device in accordance with a first embodiment according to the present invention.

FIG. 1 is a block diagram showing a configuration of a semiconductor storage device in accordance with a first embodiment according to the present invention. This semiconductor storage device is a NAND type flash memory, for example. The semiconductor storage device includes a memory cell array 100, a row decoder 130, a column decoder 160, and a read and/or write circuit 170.

The read and/or write circuit 170 is configured to be able to access to the memory cell array 100 via the column decoder 160. Gates of memory cells in the memory cell array 100 are connected to word lines extending in a row direction. Drains of the memory cells are connected to bit lines extending in a column direction. The word lines are connected to the row decoder 130, and the row decoder 130 selects one or a plurality of the word lines in accordance with an address. The bit lines are connected to the column decoder 160, and the column decoder 160 selects one or a plurality of the bit lines in accordance with the address.

The read and/or write circuit 170 includes a plurality of the sense modules 180. The sense module 180 serving as a sense unit is provided for each of the bit lines, and is configured to be able to read data stored in the memory cells or to write data in the memory cells via the bit line.

Figure 2:
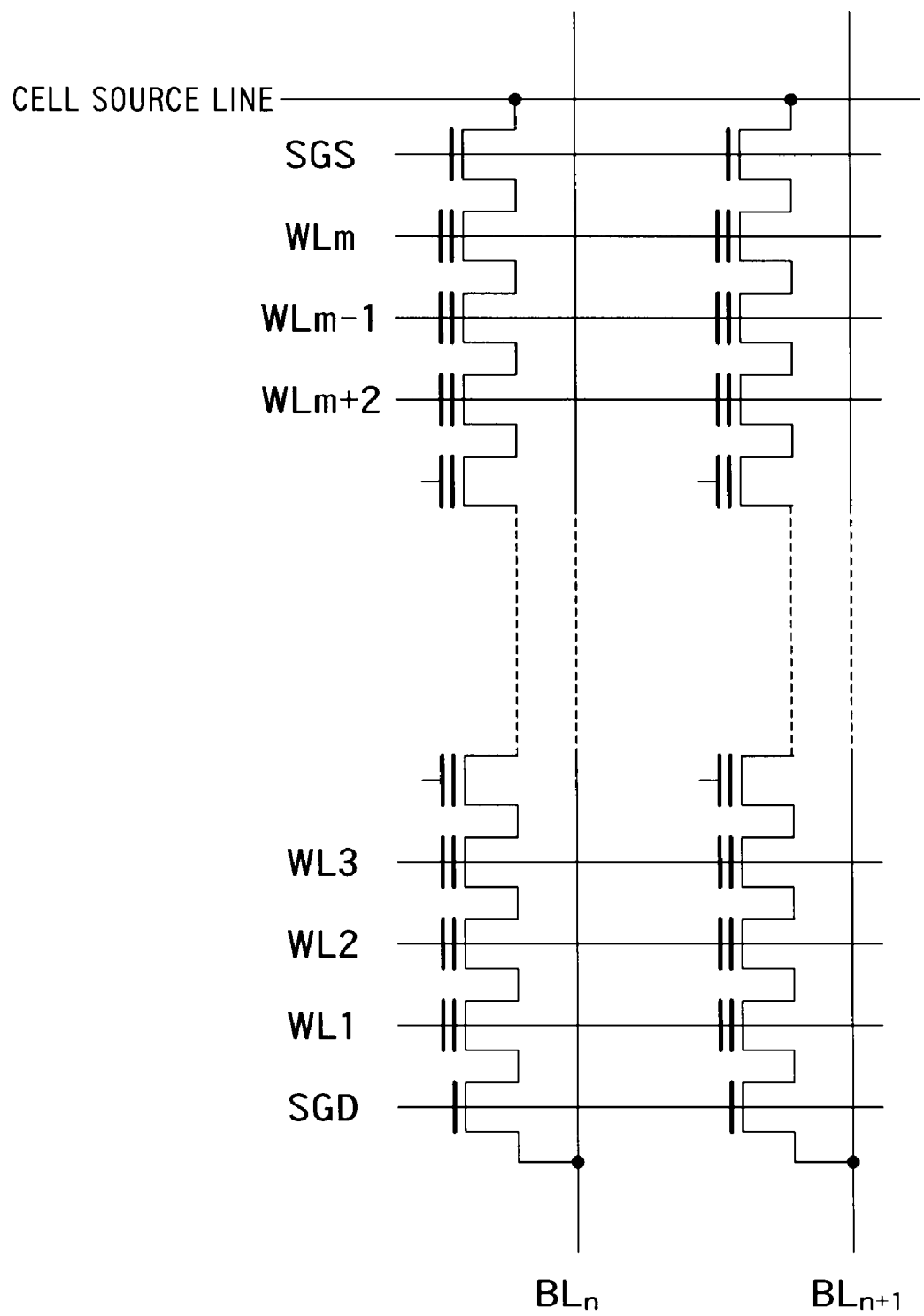
FIG. 2 is a circuit diagram showing a part of the inside of the memory cell array 100.

FIG. 2 is a circuit diagram showing a part of the inside of the memory cell array 100. In the NAND type memory, a plurality of the memory cells are connected in series and a successive self string is formed. The source side of the self string is connected to a source line via a selection gate SGS and the drain side thereof is connected to a bit line BL via a selection gate SGD.

There exist parasitic capacitance between the bit lines, and all the bit lines are connected to a common source line. In a sense system according to the present embodiment, all the bit lines are charged, charging paths to the bit lines are cut after completion of the charging, and the bit lines are discharged by a current through the memory cell. In the sense system, adjacent bit lines have an influence on each other by a joint capacitance between the bit lines. For example, when there is no capacitive coupling between the bit lines, a voltage of the bit line connected to an ON cell drops fast. However, a voltage drop of the bit line connected to an OFF cell is slow or is maintained at a constant level. On the contrary, when there is the capacitive coupling between the bit lines, and when a noticed bit line is the bit line connected to the OFF cell and the bit line connected to the ON cell are adjacent, the voltage drop of the bit line connected to the OFF cell is accelerated. Therefore, when all the bit lines are driven at the same time, it becomes impossible to correctly sense by the influence of the adjacent bit lines.

In order to suppress the influence of such capacitive coupling, there is conceivable a method which drives the bit lines every other one. That is, when one bit line of the adjacent two bit lines is selected, the other bit line is grounded. On the contrary, when the other bit line is selected, one bit line is grounded. As s result, the drop of the bit line due to such capacitive coupling can be suppressed by a shielding effect of the grounded bit line.

However, in the above method, the sense module 180 cannot detect data at the same time from all the memory cells connected to the selected word line. Consequently, the sense module 180 is disposed for every bit line and a sense system which suppresses interference between the bit lines due to the capacitive coupling is used. Accordingly, it becomes possible to detect the data at the same time from all the memory cells connected to the selected word line.

Figure 3:
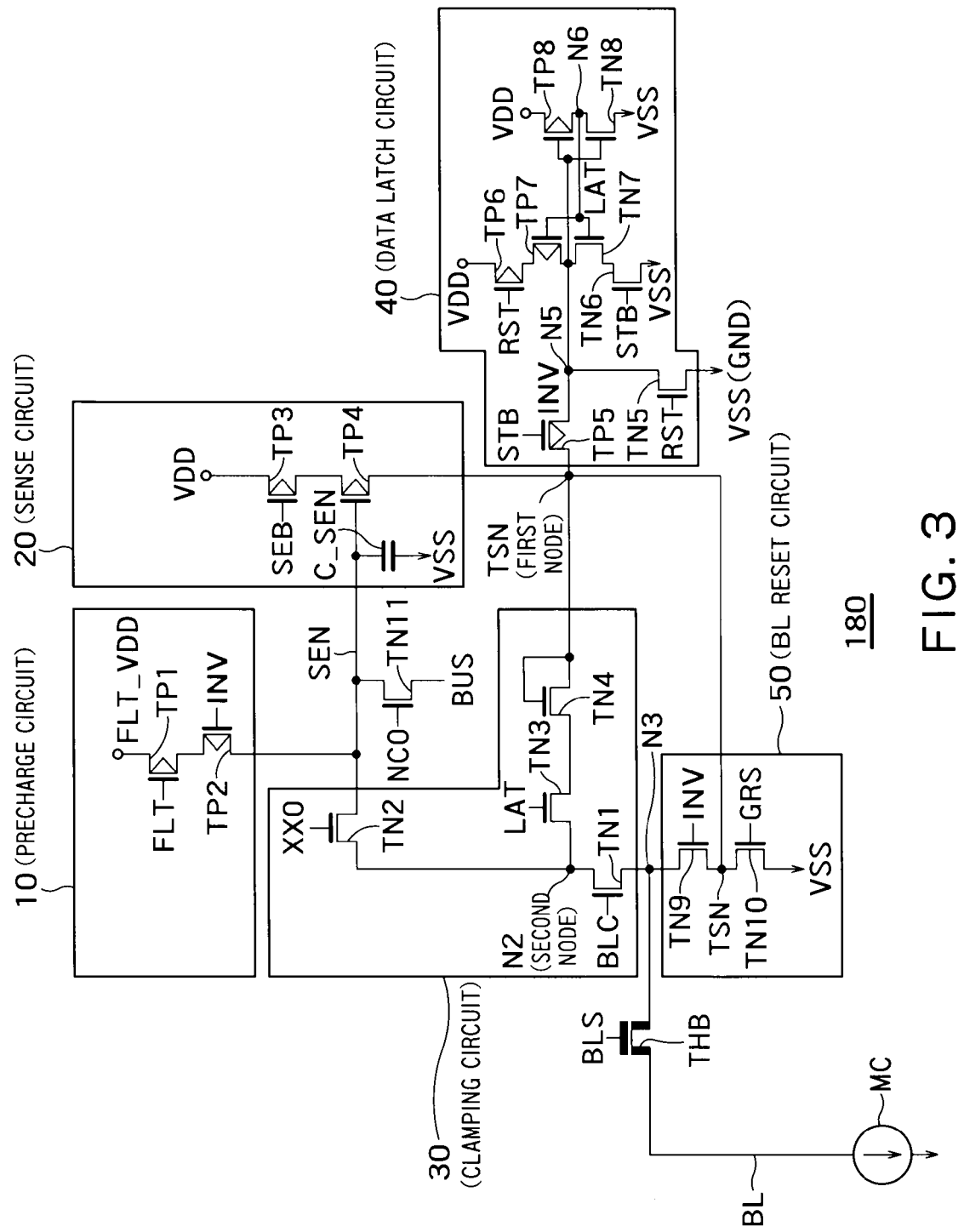
FIG. 3 is a circuit diagram showing a configuration of one sense module 180 according to the present embodiment.

FIG. 3 is a circuit diagram showing a configuration of one sense module 180 according to the present embodiment. The sense module 180 is connected to a memory cell MC via a bit line BL. A high breakdown voltage transistor THB is provided between the bit line BL and the sense module 180. The high breakdown voltage transistor THB serves to perform switching between the bit line BL and the sense module 180, and is driven by a sufficiently high gate voltage (for example, 8 V). The high breakdown voltage transistor THB is maintained in ON state when data in the memory cell MC is read by the sense module 180.

The sense module 180 includes a sense node SEN, a precharge circuit 10, a sense circuit 20, a clamping circuit 30, a data latch circuit 40, and a bit line (referred to as BL) reset circuit 50.

The precharge circuit 10 includes P-type transistors TP1 and TP2, both of which are connected in series between a power supply FLT_VDD and the sense node SEN. A gate of the transistor TP1 receives a signal FLT activated during pre-charge, and is controlled by the signal FLT. A gate of the transistor TP2 receives a signal INV based on a potential at a fifth node N5 between the sense circuit 20 and the latch circuit 40, and is controlled by the signal INV. The potential at the node N5 depends on a polarity of data latched by the latch circuit 40.

In this case, activation means that an element or a circuit is made to be turned ON or driven; and inactivation means that the element or the circuit is made to be turned OFF or stopped. Therefore, there is a case where a HIGH (high potential level) signal is an activation signal; and there is a case where a LOW (low potential level) signal is the activation signal. For example, an N-type transistor is activated by setting a gate to HIGH. On the other hand, a P-type transistor is activated by setting a gate to LOW. Furthermore, the polarity of data shows a potential level of either data "1" or data "0" in a binary storage memory; and the polarity of data shows any one of a potential of data "1," a potential of data "0", or a single or a plurality of potential levels therebetween in a multivalued storage memory.

The sense circuit 20 includes a capacitor C_SEN and P-type transistors TP3 and TP4. The capacitor C_SEN is connected between the sense node SEN and a reference power supply VSS. The reference potential VSS is a grounding potential, for example. The capacitor C_SEN supplies a charge to the memory cell MC via transistors TN2, TN1, and THB during data detection. A gate of the P-type transistor TP4 as a sense transistor is connected to the sense node SEN. One of a source or a drain of the transistor TP4 is connected to a power supply VDD via the transistor TP3. Further, the other of the source or the drain of the transistor TP4 is connected to a first node TSN. The transistor TP4 allows the power supply VDD to be connected to the first node TSN on the basis of a potential at the sense node SEN. The transistor TP3 is connected between the power supply VDD and the transistor TP4. The transistor TP3 allows the power supply VDD to be connected to the transistor TP4 on the basis of a potential of a signal SEB. The signal SEB is a signal activated during data detection after an initial pre-charge.

The first node TSN is a node connecting the sense circuit 20, the latch circuit 40, the clamping circuit 30, and the BL reset circuit 50. A potential at the first node TSN varies in accordance with the polarity of the data transmitted to the sense node SEN. For example, when the potential at the sense node SEN is a high level, the transistor TP4 is in OFF state. Therefore, the potential at the first node TSN is maintained at a low level (VSS). On the other hand, when the potential at the sense node SEN is a low level, the transistor TP4 is in ON state. Therefore, the potential at the first node TSN is changed to a high level (VDD). This allows the sense circuit 20 to amplify a signal of the sense node SEN and to transmit the same to the first node TSN.

The first node TSN connects between the sense circuit 20 and the clamping circuit 30. The sense circuit 20 supplies a charge to the bit line BL via the first node TSN and the clamping circuit 30 in response to the potential at the sense node SEN during the data detection. After that, the latch circuit 40 latches the potential at the first node TSN to the fifth node N5 via a P-type transistor TP5. The transistor TP5 is connected between the node N5 of the latch circuit 40 and the first node TSN of the sense circuit 40. The transistor TP5 allows the first node TSN to be connected to the node N5 on the basis of a potential of a signal STB. The signal STB is a strobe signal activated when the latch circuit 40 latches data. A signal of the first node TSN is transmitted to the signal INV of the node N5 by turning on the transistor TP5.

The latch circuit 40 includes P-type transistors TP6 and TP7 which are connected in series between the power supply VDD and the node N5; N-type transistors TN6 and TN7 which are connected in series between the reference potential VSS and the node N5; and P-type transistor TP8 and N-type transistor TN8 which are connected in series between the power supply VDD and the reference potential VSS. A gate of the transistor TP6 receives a reset signal RST. A gate of the transistor TN6 receives the strobe signal STB. Both gates of the transistors TP7 and TN7 are connected to a node N6 provided between the transistors TP8 and TN8. Both gates of the transistors TP8 and TN8 are connected to the node N5. With this configuration, the latch circuit 40 allows the potential at the first node TSN, the potential being amplified by the sense circuit 20, to be stored at the node N5 via the transistor TP5.

Furthermore, the latch circuit 40 includes an N-type transistor TN5 and allows the potential INV at the node N5 to be reset to the reference potential VSS (grounding potential) on the basis of the reset signal RST.

The clamping circuit 30 includes N-type transistors TN1 to TN4. The first transistor TN1 and the second transistor TN2 are connected in series between the sense node SEN and the bit line BL. The transistors TN1 and TN2 are connected to each other at a second node N2. A charge from the precharge circuit 10 and the charge from the capacitor C_SEN are supplied to the bit line BL via the second transistor TN2 and the first transistor TN1. At this time, a potential of the bit line BL is determined by a gate potential of the transistor TN1. For example, when the potential of the bit line BL is set to 0.5 V, a gate potential BLC of the transistor TN1 may be set to (0.5+Vt1). Vt1 is a threshold voltage of the transistor TN1. Since a potential at a node N3 is lower than a potential at the node N2, the transistor TN1 becomes OFF when a potential difference between the node N3 and BLC is below Vt1. That is, when the potential (potential at the node N3) of the bit line BL is tried to exceed 0.5 V, the transistor TN1 becomes OFF. Therefore, the potential of the bit line BL does not exceed 0.5 V. Accordingly, the potential of the bit line BL is maintained at 0.5 V, as long as the potential at the node N2 is higher than the potential at the node N3 and a current is sufficiently supplied from the node N2 to the node N3.

From the same reason, the potential at the node N2 is determined by a gate potential XX0 of the transistor TN2. For example, when the potential at the node N2 is set to 0.7 V, the gate potential XX0 of the transistor TN2 may be set to (0.7+Vt2). Vt2 is a threshold voltage of the transistor TN2. When the potential at the sense node SEN is higher than the potential at the node N2, the potential at the node N2 is maintained at 0.7 V. Of course, when the potential at the sense node SEN is below the potential (0.7 V) at the node N2, the potential at the node N2 also decreases with the decrease of the potential at the sense node SEN.

In addition, as described above, the high breakdown voltage transistor THB serves as a switching element, and is driven by a sufficiently high gate potential BLS. Consequently, the potential BLS is not substantially related with the potential of the bit line BL.

The transistors TN3 and TN4 are connected in series between the first node TSN and the second node N2. The transistor TN3 serves as a switching element. A gate of the transistor TN4 is connected to the first node TSN together with its drain. This makes the transistor TN4 serve as a diode unit which allows a current to flow from the first node TSN to the second node N2. When the potential at the sense node SEN decreases to not higher than a predetermined potential during data detection, the sense circuit 20 supplies a charge from the power supply VDD to the bit line BL via the transistor TP4, the first node TSN, the transistors TN4, TN3, and TN1, in place of the capacitor C_SEN. At this time, the transistor TN4 is diode-connected between the first node TSN and the second node N2. Therefore, a current is unilaterally supplied from the power supply VDD to the bit line BL.

The BL reset circuit 50 is provided between the first node TSN and a third node. The third node is a node connected to the clamping circuit 30, the BL reset circuit 50, and the bit line BL. The BL reset circuit 50 includes N-type transistors TN9 and TN10 which are connected in series between the third node N3 and the reference potential VSS. A node between the transistors TN9 and TN10 is connected to the first node TSN. A gate of the transistor TN9 is connected to the signal INV, and a gate of the transistor TN10 is connected to a signal GRS. The BL reset circuit 50 is configured to maintain a bit line potential at the reference potential VSS (grounding potential) when the memory cell MC is clearly an ON cell. When it is uncertain whether or not the memory cell MC is the ON cell, the BL reset circuit 50 does not allow the bit line potential to be reset to the reference potential VSS. Data of the memory cell MC other than the ON cell is detected again in a state where only the bit line potential connected to the ON cell is maintained at the reference potential VSS (grounding potential). This prevents a capacity coupling from being formed between a bit line connected to the ON cell and a bit line other than that. Furthermore, when a current is supplied to the bit line connected to the ON cell, a large amount of charges is supplied to a common source line. Therefore, disadvantageously, a potential of the common source line increases. An increase of the potential of the common source line during data detection can be suppressed by maintaining the bit line connected to the ON cell at the grounding potential. As a result, the sense module 180 can correctly detect data of the memory cell MC other than the ON cell.

An N-type transistor TN11 is connected between the sense node SEN and an outside bus BUS. Data of the memory cell MC detected at the sense node SEN is read to the outside bus BUS via the transistor TN11.

Next, an operation of the sense module 180 according to the present embodiment will be described in particular.

Figure 4:
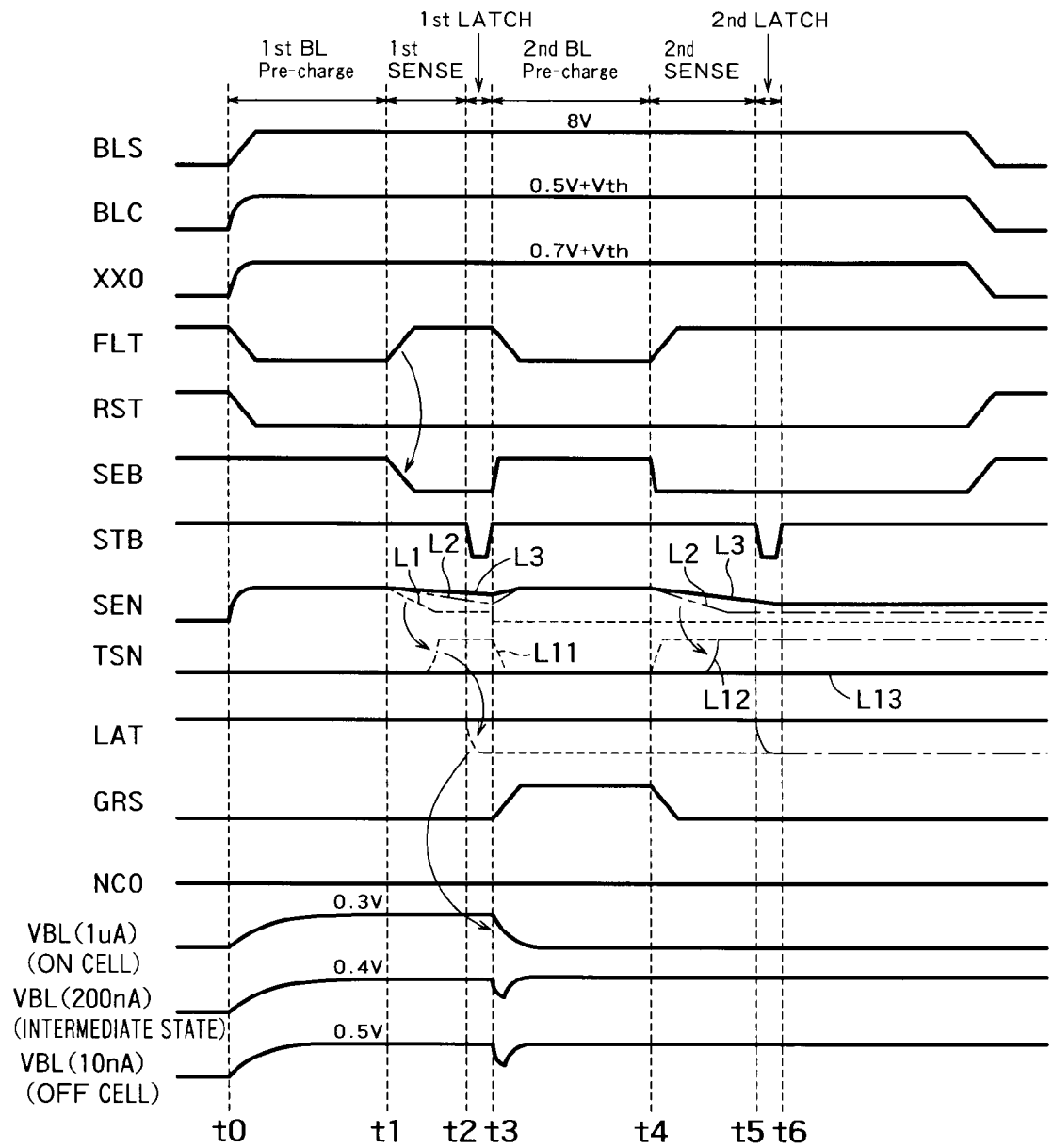
FIG. 4 is a timing chart showing a data detection operation of the sense module 180 according to the present embodiment.

FIG. 4 is a timing chart showing a data detection operation of the sense module 180 according to the present embodiment. As an initial state, a potential INV at the node N5 and a potential at the first node TSN are set to a low level potential VSS. Therefore, first, the transistor TP2 shown in FIG. 3 is in ON state and the transistor TN9 is in OFF state. A potential at a node N6 (LAT) of the latch circuit 40 is at a high level VDD.

Furthermore, in a data detection period, the transistor THB is maintained in ON state by a sufficiently high gate potential BLS (8V).

(First Pre-Charge Operation: t0 to t1)

In t0 to t1, the sense module 180 executes a first pre-charge operation. In the pre-charge operation, a signal FLT is activated to a low level and the transistor TP1 is turned ON in the precharge circuit 10. At this time, since the transistor TP2 is in ON state, the sense node SEN is charged to a potential FLT_VDD. The potential FLT_VDD is a potential equal to the potential VDD or higher than that.

A gate potential XX0 of the transistor TN2 is (0.7 V+Vt2), and a gate potential BLC of the transistor TN1 is (0.5 V+Vt1). Consequently, the bit line BL (node N3) is charged to the maximum 0.5 V (gate potential BLC−Vt1), and the node N2 is charged to the maximum 0.7 V (gate potential XX0−Vt2). In the case where the memory cell MC is an OFF cell, the bit line BL is charged to approximately 0.5 V. However, when the memory cell MC is an ON cell, a relatively large current flows through the memory cell MC. Therefore, there is a possibility that the bit line BL is not charged to 0.5 V. For example, as shown in FIG. 4, when a current flowing through the memory cell MC is 10 nA, that is, when the memory cell MC is the OFF cell, a bit line potential VBL is charged to 0.5 V. When the current flowing through the memory cell MC is 1 µA, for example, the bit line potential VBL can only be charged to 0.3 V. When the current flowing through the memory cell MC is 200 nA, the bit line potential VBL is charged to 0.4 V, for example. For descriptive purposes, a memory cell whose cell current is 1 µA is referred to as a first ON cell, and a memory cell whose cell current is 200 nA is referred to as a second ON cell.

(First Detection Operation: t1 to t2)

After the pre-charge operation, the sense module 180 executes a detection operation. In a first detection operation, the sense module 180 corresponding to all bit lines BL executes the detection operation.

In the detection operation, the FLT is inactivated to the high level potential, and the power supply FLT_VDD of the pre-charge circuit 10 is cut from the sense node SEN. With this cut, the SEB is activated to the low level potential, and the transistor TP3 of the sense circuit 20 allows the power supply VDD to be connected to the transistor TP4. Furthermore, since the potential at the node N6 (LAT) is at the high level potential VDD, the transistor TN3 is in ON state.

Since the power supply FLT_VDD is cut from the sense node SEN, a charge accumulated in the capacitor C_SEN is supplied to the bit line BL via the transistors TN2, TN1, and THB. At this time, when the memory cell MC is the OFF cell, an amount of charges drained from the capacitor C_SEN is small. Therefore, the lowering speed of the potential at the sense node SEN is slow. A change in potential at the sense node SEN when the memory cell MC is the OFF cell is shown by L3. In the case where the memory cell MC is the ON cell, the charge from the capacitor C_SEN is drained fast. Therefore, the lowering speed of the potential at the sense node SEN is fast. A change in potential at the sense node SEN when the memory cell MC is the first ON cell is shown by L1. A change in potential at the sense node SEN when the memory cell MC is the second ON cell is shown by L2.

When the memory cell MC is the ON cell, the potential at the sense node SEN decreases fast. When the potential at the sense node SEN becomes not higher than (VDD−|Vt4|), the transistor TP4 becomes ON state. In addition, Vt4 is a threshold voltage of the transistor TP4. This causes the potential at the node TSN to be raised to the high level potential VDD as shown in FIG. 4. Since a potential difference between the node TSN and the node N2 exceeds the threshold of the diode-connected transistor TN4, it allows a current to flow from the node TSN to the node N2. As described above, when the potential at the sense node SEN becomes not higher than (VDD−|Vt4|), the sense circuit 20 supplies a charge to the bit line BL. Each potential at the node N2 and at the sense node SEN is tried to be raised by the charge supply by the sense circuit 20. However, the transistor TP4 becomes OFF state when the potential at the sense node SEN exceeds (VDD−|Vt4|). As a result, the potential at the sense node SEN is converged to (VDD−|Vt4|).

The potential (VDD−Vt4|) at the sense node SEN corresponding to the first ON cell is equal to the potential at the node N2, as long as the potential at the sense node SEN does not exceed (XX0−Vt2). Further, the potential at the node N2 is equal to the potential of the bit line BL, as long as the potential at the node N2 does not exceed (BLC−Vt1). This means that the potential (VDD−|Vt4|) can be lowered down to the potential (0.5 V in the present embodiment) of the bit line BL.

In the known art, there exists no path (path from the node TSN to the node N2) for allowing a charge to be supplied from the sense circuit 20 to the bit line BL. Therefore, when the potential at the sense node SEN decreases, the precharge circuit 10 supplies a charge to the bit line BL. In this case, the precharge circuit 10 supplies the charge from the sense node SEN to the bit line BL via the transistors TN2 and TN1. Consequently, the potential at the sense node SEN can be only lowered down to (XX0−Vt2). For example, when the potential at the XX0 is set to (0.7 V−Vt2) as in the present embodiment, the potential at the sense node SEN can be only lowered down to 0.7 V.

The present embodiment enables the potential at the sense node SEN to be lowered down to a lower level than before without lowering the gate potential BLC of the transistor TN1 by providing the charge supply path from the sense circuit 20 to the bit line BL. This allows the transistor TP4 corresponding to the ON cell to be surely turned on without lowering the potential of the bit line BL corresponding to the ON cell.

In t1 to t2, only the transistor TP4 of the sense module 180 corresponding to the ON cell is turned ON, and supplies the charge to the bit line BL. The transistor TP4 of the sense module 180 corresponding to the OFF cell and the second ON cell is maintained in OFF state, and does not supply the charge to the bit line BL. Therefore, only the potential at the node TSN of the sense module 180 corresponding to the first ON cell is raised to the high level potential VDD. The potential at the node TSN of the sense module 180 corresponding to the second ON cell and the OFF cell other than that is maintained at the low level potential VSS.

(First Latch Operation: t2 to t3)

In t2 to t3, the transistor TP5 is turned ON by activating the strobe signal STB to the low level potential. This causes the transistor TP5 to connect the node TSN to the node N5.

In the sense module 180 corresponding to the first ON cell, the potential INV at the node N5 becomes the high level potential VDD. The potential LAT at the node N6 is inverted from the high level potential VDD to the low level potential VSS by the potential INV at the node N5.

On the other hand, in the sense module 180 corresponding to the cell other than the first ON cell, the potential INV at the node N5 is maintained at the low level potential VSS. The potential LAT at the node N6 is maintained at the low level potential VSS. As described above, the potential at the node TSN is latched by the latch circuit 40 by the activation of the strobe signal STB.

(Second Pre-charge Operation: t3 to t4)

The first pre-charge operation and the first detection operation are executed to all the sense modules 180. That is, a current (cell current) is supplied to all the memory cells MC connected to the selected word line during data detection. When the cell current is supplied to all the memory cells, a large current is flown to the source line as a whole. Therefore, the potential of the source line is floated (raised) from the VSS. When the source potential floats, the cell current of the memory cell other than the first ON cell becomes very small. Consequently, a second pre-charge operation and a second detection operation post t3 are executed to the sense module 180 corresponding to cells other than the first ON cell. During this period, the sense module 180 corresponding to the first ON cell resets the potential at the bit line BL corresponding to that to the VSS (grounding potential). The large cell current is not flown to the source line by setting the potential of the bit line BL corresponding to the first ON cell to be equal to the source potential. Consequently, under a state where the rise of the source potential is suppressed, data of the OFF cell and data of the second ON cell which is not detected as the ON cell during the first detection operation can be obtained.

In more detail, immediately after t3, a gate potential GRS of the transistor TN10 in the BL reset circuit 50 is activated to the high level potential. This allows the node TSN to be reset to the grounding potential VSS. A gate potential SEB of the transistor TP3 is inactivated to the high level potential VDD.

In this case, in the sense module 180 corresponding to the first ON cell, the potential INV at the node N5 is retained at the high level potential VDD. Therefore, the transistor TN9 is in ON state. This allows the bit line BL to be reset to the low level potential VSS. At this time, the node TSN of the sense module 180 corresponding to the first ON cell is lowered once to the low level potential VSS, as shown by a line L11. In this regard, however, since the transistor TP5 is in OFF state, the latch circuit 40 corresponding to the first ON cell continues to latch the high level potential VDD as the potential INV of the node N5, and to latch the low level potential VSS as the potential LAT of the node N6.

On the other hand, in the sense module 180 corresponding to cells other than the first ON cell, the potential INV at the node N5 is retained at the low level potential VSS. Therefore, the transistor TN9 is in OFF state. Consequently, the bit line BL is not reset. In addition, the potential of the bit line BL connected to the cells other than the first ON cell is temporarily lowered by capacitive coupling with the bit line BL connected to the first ON cell. However, the potential immediately is returned to the potential of the precharge state by the charge supply from the precharge circuit 10.

Under such states, the capacitor C_SEN, the sense node SEN, and the bit line BL are pre-charged as in the first precharge operation. With this operation, the capacitor C_SEN, the sense node SEN, and the bit line BL corresponding to the cells other than the first ON cell are pre-charged.

(Second Detection Operation: t4 to t5)

In a second detection operation, when the GRS is inactivated to the low level potential VSS and the SEB is activated to the low level potential VSS, the VDD is connected to the transistor TP4.

In the sense module 180 corresponding to the first ON cell, since the sense node SEN is maintained at the low level potential VSS, the node TSN is charged to the high level potential VDD. In addition, in the sense module 180 corresponding to the first ON cell, since the GRS and the LAT are the low level potential VSS, the node TSN is not connected to the bit line BL.

On the other hand, in the sense module 180 corresponding to the cells other than the first ON cell, since the LAT is the high level potential VDD, the sense module 180 executes a data detection operation as in the first detection operation. The second detection operation is executed under a state where the rise of the source line potential is suppressed. Consequently, in the sense module 180 connected to the second ON cell, the potential at the sense node SEN is under (VDD−|Vt4|), and the transistor TP4 is turned ON. The potential at the node TSN is raised to the high level potential VDD as shown by a line L12. On the other hand, in the sense module 180 corresponding to the OFF cell, the sense node SEN is maintained at not lower than (VDD−|Vt4|), and the transistor TP4 is maintained in OFF state. The node TSN corresponding to the OFF cell is maintained at the low level potential VSS as shown by a line L13. As described above, since the second detection operation is executed under the sate where the rise of the source line potential is suppressed, the sense module 180 can discriminate the second ON cell from the OFF cell.

(Second Latch Operation: t5 to t6)

In t5 to t6, the transistor TP5 is turned ON by activating the strobe signal STB to the low level potential. This causes the transistor TP5 to connect the node TSN to the node N5.

In the sense module 180 corresponding to the first ON cell and the second ON cell, the potential at the node TSN is the high level potential VDD. Therefore, the potential INV at the node N5 becomes the VDD. Consequently, the latch circuit 40 latches the low level potential VSS as the potential LAT at the node N6.

On the other hand, in the sense module 180 corresponding to the OFF cell, the potential INV at the node N5 is maintained at the low level potential VSS. Consequently, the latch circuit 40 is maintained at the high level potential VDD as the potential LAT at the node N6.

As described above, in t0 to t3, data of the first ON cell is discriminated from data of the cell other than that. In t3 to t6, data of the second ON cell is discriminated from data of the OFF cell.

After that, when the latch circuit 40 is reset, the potential INV at the node N5 is reset to the low level potential VSS by activating the gate potential RST of the transistor TN5.

According to the present embodiment, the potential at the sense node SEN can be lowered down to a lower level than before without lowering the gate potential BLC of the transistor TN1. This allows the transistor TP4 corresponding to the first ON cell to be surely turned on without lowering the potential at the bit line BL corresponding to the first ON cell.

In the known example disclosed in U.S. Pat. No. 7,046,568, the potential of the bit line and the potential at the sense node are determined by gate potentials of three or more transistors. Consequently, an additional circuit for generating not less than three types of gate potentials is required. However, in the present embodiment, the potential of the bit line BL and the potential at the sense node SEN are determined by the gate potentials BLC and XX0 of the two transistors TN1 and TN2. Therefore, in the present embodiment, an additional circuit (not shown in the drawing) which generates two types of gate potentials BLC and XX0 is enough. That is, in the present embodiment, an intermediate potential between the potentials VSS and VDD is small. This allows the sense module 180 according to the present embodiment to realize a simpler circuit configuration than before.

Second Embodiment

Figure 5:
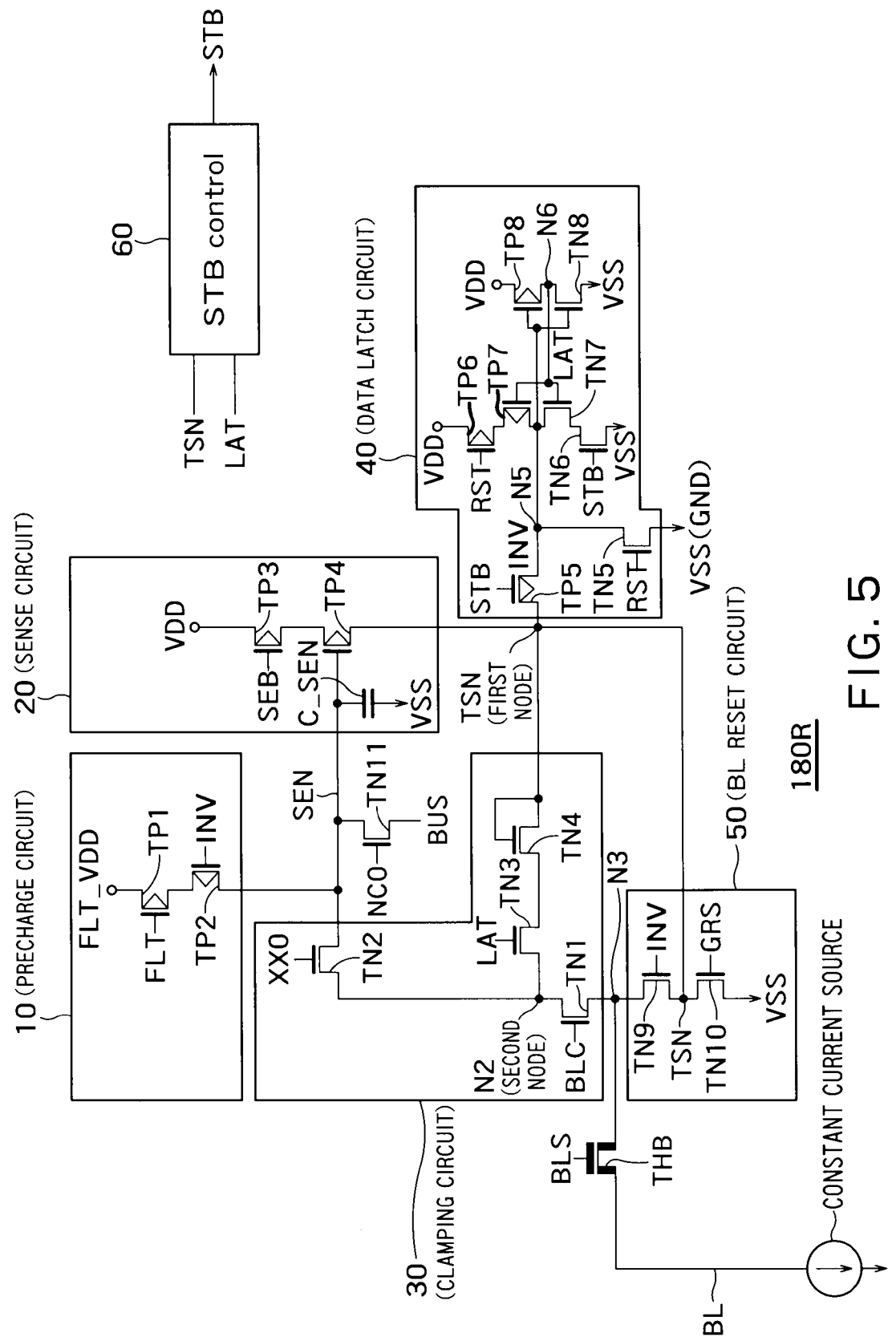
FIG. 5 is a circuit diagram showing a configuration of a replica circuit 180R which is incorporated in a memory chip and is for controlling a sense module 180.

FIG. 5 is a circuit diagram showing a configuration of a replica circuit 180R which is incorporated in a memory chip and is for controlling a sense module 180. The replica circuit 180R is a circuit which is differently provided from the sense module 180 to supply a strobe signal STB to the sense module 180. The replica circuit 180R is connected to a constant current source in place of a memory cell MC. Furthermore, the replica circuit 180R includes a set to box (referred to as STB) control circuit 60 which is for generating the strobe signal STB. Other configuration of the replica circuit 180R is the same as that of the sense module 180.

The STB control circuit 60 receives a potential at a node TSN and a potential LAT of a latch circuit 40, and drives the strobe signal STB on the basis of their potential levels.

For example, first, when the potential at the node TSN is a low level potential VSS and the potential LAT is a high level potential VDD, the STB control circuit 60 outputs the potential VDD as a potential of the STB. After that, when the replica circuit 180R operates and the potential at the node TSN becomes the high level potential VDD, the STB control circuit 60 outputs the low level potential VSS as the STB. The strobe signal STB also controls a transistor TP5 of the replica circuit 180R. Therefore, after a lapse of a predetermined time from the potential at the node TSN is changed to the potential VDD, the potential LAT is changed to the low level potential VSS. This allows the STB control circuit 60 to return the potential of the signal STB to the potential VDD. As a result, it becomes possible to activate the strobe signal STB during only the predetermined time (only when being latched). It is possible to arbitrarily set a period for activating the strobe signal STB by combining delay circuits or the like.

Consequently, a control of the replica circuit 180R is easy and an operation nearer to the operation of the sense module 180 can be executed. As a result, the replica circuit 180R can output the strobe signal STB to the sense module 180 at a more suitable timing. The second embodiment can further obtain the effect of the first embodiment. The second embodiment can be combined with the following third to fifth embodiments. In this case, the replica circuit 180R may have the same configuration as that of sense modules to be combined with the embodiments.

Third Embodiment

A third embodiment is different from the first embodiment in that a pre-charge potential FLT_VDD is set to be higher than a VDD.

Figure 6:
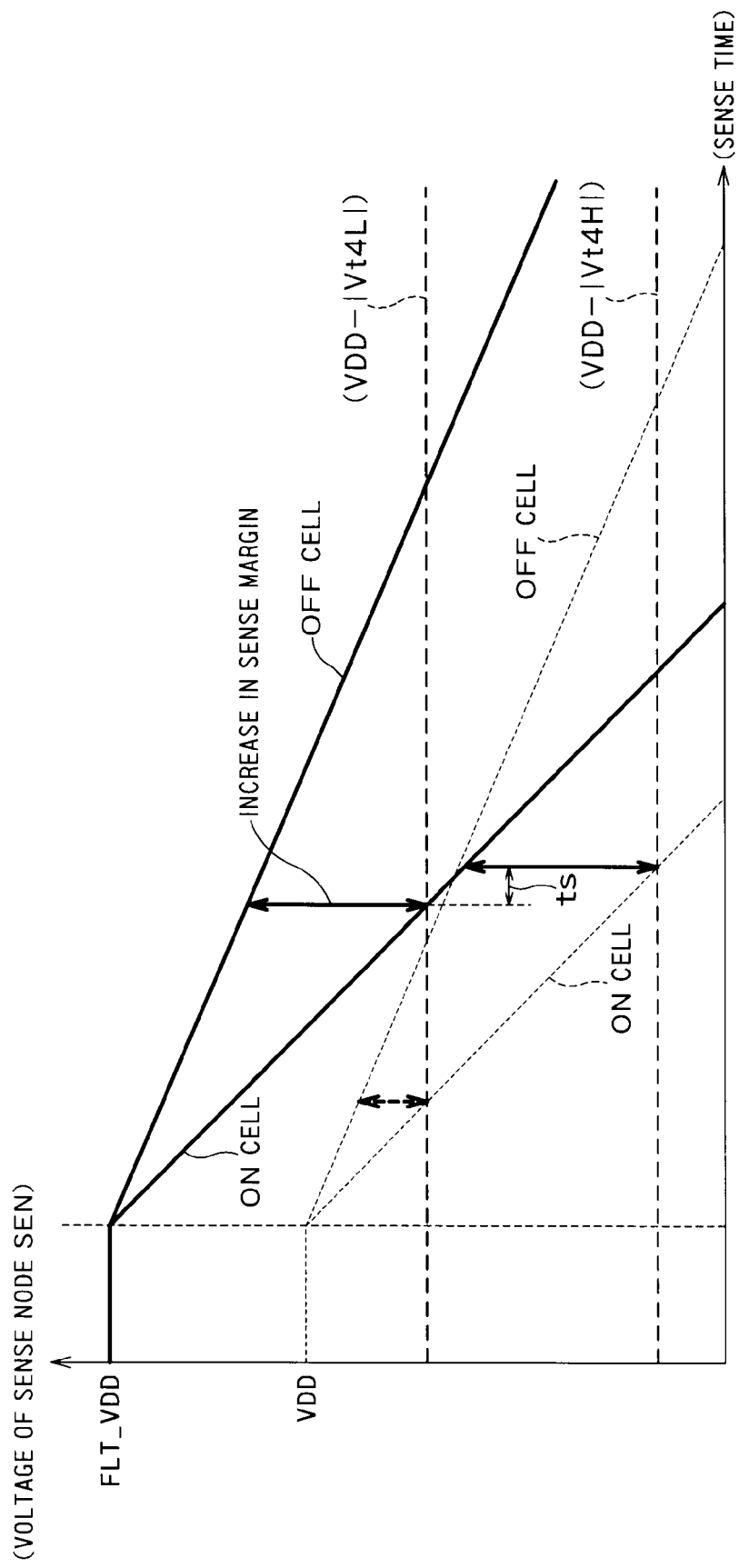
FIG. 6 is a graph showing a relation between a potential at a sense node SEN and a sense margin after pre-charging in the third embodiment.

FIG. 6 is a graph showing a relation between a potential at a sense node SEN and a sense margin after pre-charging in the third embodiment. This graph shows potentials at each sense node SEN connected to an ON cell and an OFF cell. An effect when the potential at the sense node SEN after pre-charging is set to the potential FLT_VDD which is higher than the VDD will be described below.

In U.S. Pat. No. 7,046,568, the precharge circuit supplies a charge to the bit line BL during data detection, however, in the present embodiment, the sense circuit 20 supplies a charge to the bit line BL during data detection. Therefore, in the present embodiment, a pre-charge potential can be differed from a charge supply potential during data detection. A sense margin can be increased by setting the pre-charge potential to the potential FLT_VDD which is higher than the VDD. Potential levels (VDD−|Vt4L|) and (VDD−|Vt4H|) are determined by setting the charge supply potential during data detection to the VDD. An initial potential of the sense node SEN in the detection is determined to the FLT_VDD by setting the pre-charge potential to the FLT_VDD. In other words, in the present embodiment, the sense margin can be increased by changing the pre-charge potential at the sense node SEN without changing an operation level of the transistor TP4 during detection.

More specifically, a threshold voltage Vt4 of the transistor TP4 varies for each sense module 180. The maximum threshold voltage among all the sense modules 180 in a certain memory cell array is set to Vt4H, and the minimum threshold voltage is set to Vt4L. Looking at a sense margin at the time when the potential at the sense node SEN in the ON cell is below the (VDD−|Vt4L|), the sense margin becomes large when the pre-charge potential is high, such as the FLT_VDD. The sense margin is a signal difference (potential difference) between data of the ON cell and data of the OFF cell.

In this case, since the gate potential BLC of the transistor TN1 is not changed, the potential of the bit line BL is not changed and electric power consumption does not increase. Electric power consumption increases by an increase in the potential at the sense node SEN. However, capacitance of the sense node SEN is very small. Therefore, the increase in the electric power consumption is not so large.

Furthermore, since the pre-charge potential at the sense node SEN can be changed without changing an operation level of the transistor TP4 during detection, the FLT_VDD can be changed in response to a threshold voltage Vt4 of the transistor TP4.

For example, the Vt4H shown in FIG. 6 is set to the threshold voltage of the transistor TP4 when a temperature is low, and the Vt4L is set to the threshold voltage of the transistor TP4 when the temperature is high. Since the threshold voltage |Vt4| becomes high when the temperature is low, the FLT_VDD is set to a low level. On the contrary, since the threshold voltage |Vt4| becomes low when the temperature is high, the FLT_VDD is set to a high level. This allows a sense time difference ts due to a change in the threshold voltage Vt4 of the transistor TP4 to be small. The third embodiment can further obtain the effect of the first embodiment. The third embodiment can be combined with the following fourth and fifth embodiments.

Fourth Embodiment

A fourth embodiment is different from the first embodiment in that a capacitor C_SEN is connected between a second node N2 and a low level potential VSS. Furthermore, the fourth embodiment is different from the first embodiment in that a transistor TN11 is connected to the node N2. Other configuration of the fourth embodiment may be the same configuration as that of the first embodiment.

Figure 7:
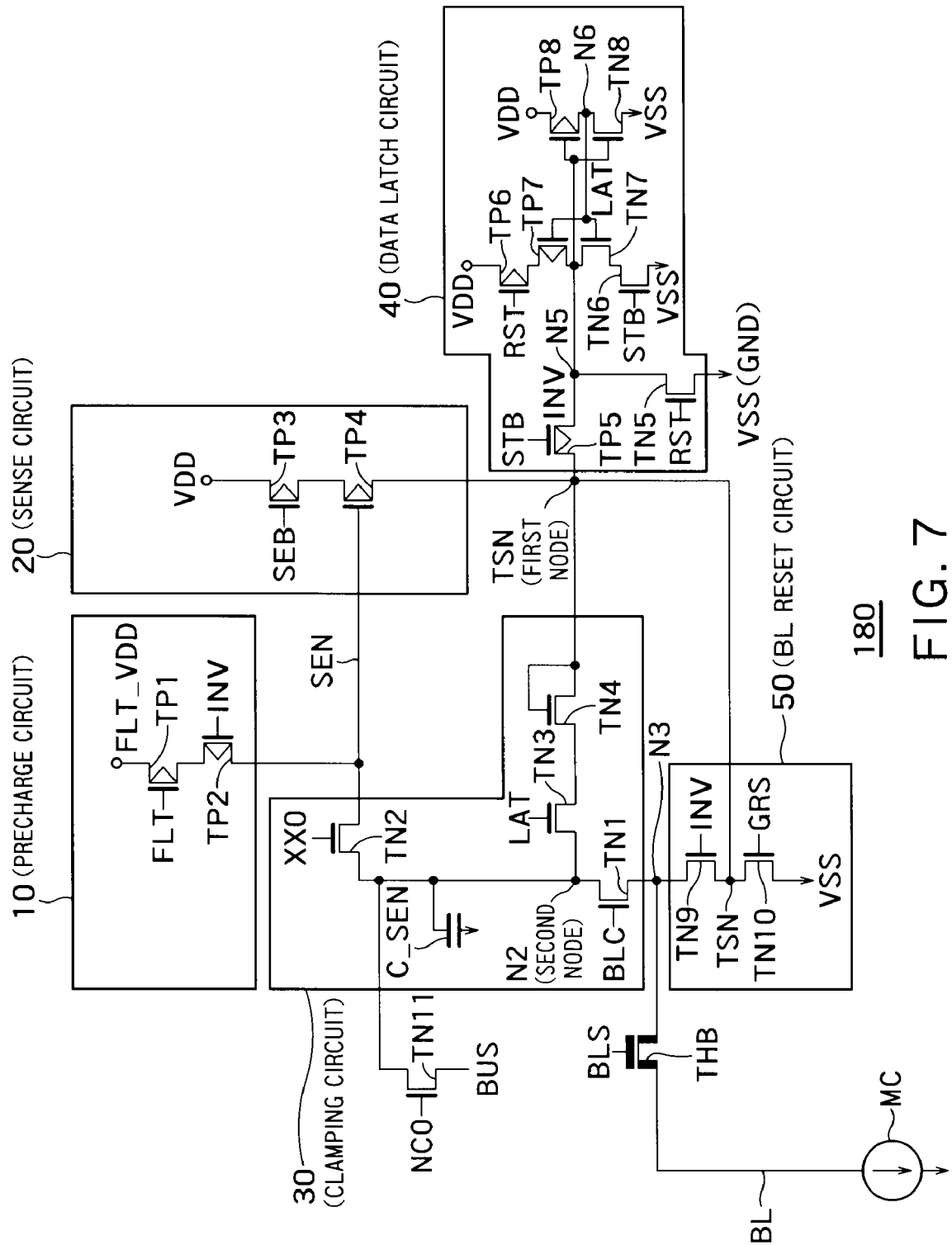
FIG. 7 is a circuit diagram showing a configuration of a sense module 180 according to the fourth embodiment.

FIG. 7 is a circuit diagram showing a configuration of a sense module 180 according to the fourth embodiment. In the fourth embodiment, one electrode of the capacitor C_SEN is connected to the node N2 between transistors TN1 and TN2, and the other electrode is connected to the low level potential VSS.

Figure 8:
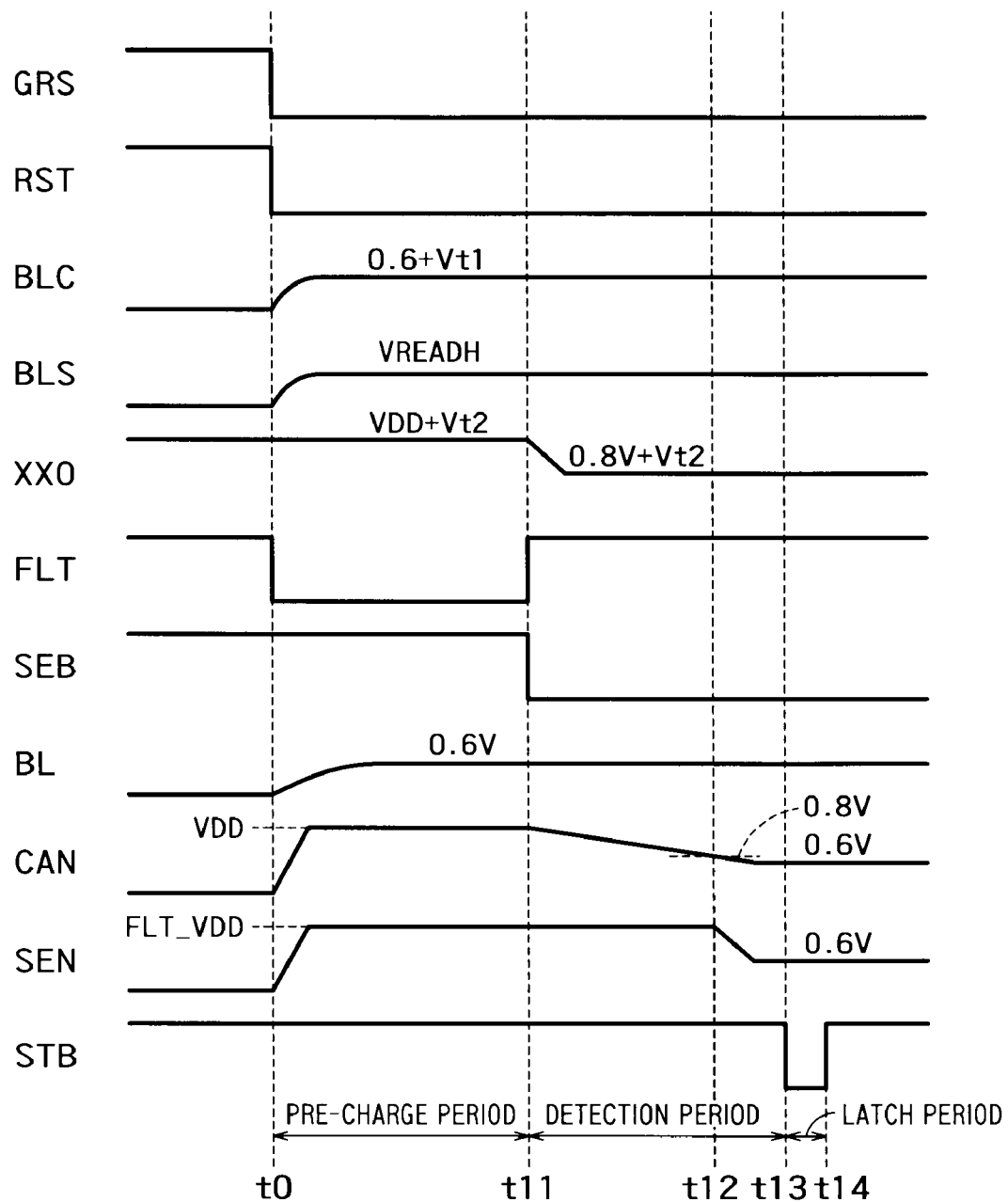
FIG. 8 is a timing diagram showing an operation of the sense module 180 according to the fourth embodiment.

FIG. 8 is a timing diagram showing an operation of the sense module 180 according to the fourth embodiment. A potential at the node N2 is shown by CAN. FIG. 8 shows only a first pre-charge operation, a first detection operation, and a first latch period. Since a second pre-charge operation and the like can be easily presumed from FIG. 8, their description will be omitted.

In the fourth embodiment, a gate potential XX0 of the transistor TN2 is set to (VDD+Vt2) when pr-charging, and the potential CAN at the node N2 is charged to a VDD. After that, in a detection operation, the gate potential XX0 is lowered down to (bit line potential VBL+0.2+Vt2). In the fourth embodiment, the potential of the bit line BL is pre-charged to 0.6 V. Therefore, in the detection operation, the gate potential XX0 is (0.8+Vt2). Operations of other control signals of the fourth embodiment may be the same as the operations of the control signals of the first embodiment.

In a pre-charge period (t10 to t11), a potential at a sense node SEN is charged to a FLT_VDD. Further, in this case, the gate potential XX0 is (VDD+Vt2); and therefore, the potential CAN is charged to the VDD.

Operations of the potentials CAN and SEN in the next detection period (t11 to t13) should be noted. The potential CAN is gradually reduced by allowing the capacitor C_SEN to supply a charge to the bit line BL. However, since the potential XX0 is lowered down to (0.8+Vt2), the transistor TN2 is maintained in OFF state till the potential CAN is below 0.8 V. In t12, when the potential CAN is below 0.8 V, the transistor TN2 is turned ON to allow the sense node SEN to be connected to the bit line BL via the transistors TN2 and TN1. At this time, since the potential CAN at the node N2 is lowered down to less than 0.8 V, the potential at the sense node SEN is lowered at once to less than 0.8 V from the FLT_VDD. This is because that the capacitor C_SEN is not connected to the sense node SEN and therefore parasitic capacitance at the sense node SEN is very small as compared with the first to the third embodiments. As a result, the potential at the sense node SEN and the potential CAN are lowered down to the bit line potential.

As described above, so-called, charge transfer sensing is performed by allowing the capacitor C_SEN to be connected to the second node N2. A latch operation (t13 to t14) in the fourth embodiment may be the same as that of the first embodiment.

Figure 9:
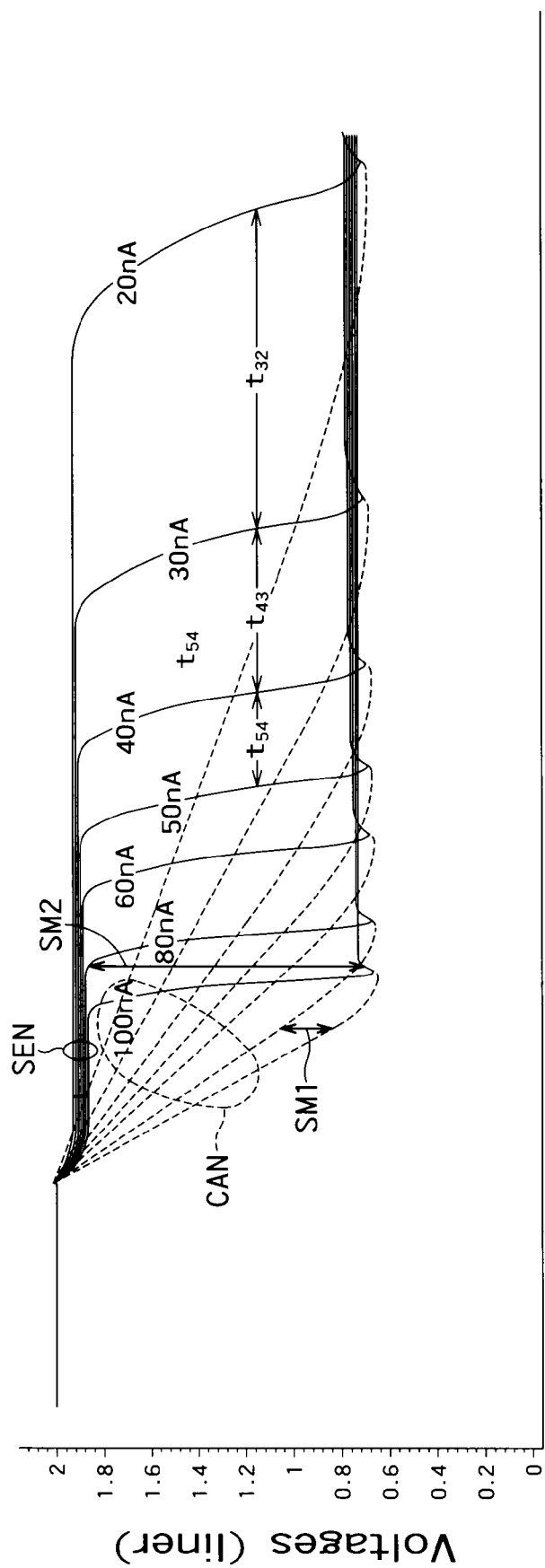
FIG. 9 is a timing diagram showing an operation of the potentials CAN and SEN in the detection period (t12 to t13)

FIG. 9 is a timing diagram showing an operation of the potentials CAN and SEN in the detection period (t12 to t13). This drawing shows an operation of the potentials CAN and SEN at different cell currents (20 nA to 100 nA). From FIG. 9, it turns out that the potential at the sense node SEN is rapidly lowered irrespective of the cell current when the potential CAN is below 0.8 V. A sense margin SM2 of the potential at the sense node SEN is very large with respect to a sense margin SM1 of the potential CAN. Consequently, it is not necessary to consider a variation of the threshold voltage Vt4 due to temperature and the like as shown in FIG. 6. In other words, since the potential at the sense node SEN is lowered at once in a short time, a time (time that charge transfer is generated) that the potential at the sense node SEN crosses the potential (VDD−Vt4) stays about the same even if the threshold voltage Vt4 varies.

In spite of that the fourth embodiment is not different from the first embodiment in the circuit size, the sense margin can be largely improved. The fourth embodiment has a path from the node TSN to the node N2. Therefore, the fourth embodiment also has the effect of the first embodiment.

The fourth embodiment can also be applied to a replica circuit. In this case, the fourth embodiment can have the effect of the second embodiment. Further, in the fourth embodiment, the pre-charge potential FLT_VDD may be not lower than the VDD. In this case, the fourth embodiment can also have the effect of the third embodiment.

In addition, in the timing diagram shown in FIG. 9, the lower the cell current is, the larger a time difference at a time when the charge transfer to the cell current is generated is. For example, a time difference t43 between charge transfer in the case when the cell current is 40 nA and charge transfer in the case when the cell current is 30 nA is longer than a time difference t54 between charge transfer in the case when the cell current is 50 nA and charge transfer in the case when the cell current is 40 nA. Furthermore, similarly, a time difference t32 between charge transfer in the case when the cell current is 30 nA and charge transfer in the case when the cell current is 40 nA is longer than the time difference t43. This means that the lower the cell current is, the more improved the sense margin is.

When a cell whose cell current is 50 nA is set as an ON cell and a cell whose cell current is 40 nA is set as an OFF cell, its ON/OFF ratio becomes 1.25. When a cell whose cell current is 40 nA is set as an ON cell and a cell whose cell current is 30 nA is set as an OFF cell, its ON/OFF ratio becomes 1.33. When a cell whose cell current is 30 nA is set as an ON cell and a cell whose cell current is 20 nA is set as an OFF cell, its ON/OFF ratio becomes 1.5. That is, in the fourth embodiment, it turns out that the larger the ON/OFF ratio is, the more improved the sense margin is. Consequently, in order to execute the detection operation at a faster pace, it may be set the ON/OFF ratio as large as possible.

The ON/OFF ratio is fundamentally determined by the cell current of the memory cell MC. However, the ON/OFF ratio can be increased by adopting a method such as the following fifth embodiment.

Fifth Embodiment

In a fifth embodiment, a gate potential BLC of a transistor TN1 in a pre-charge operation is set to be higher than that in a detection operation.

Figure 10:
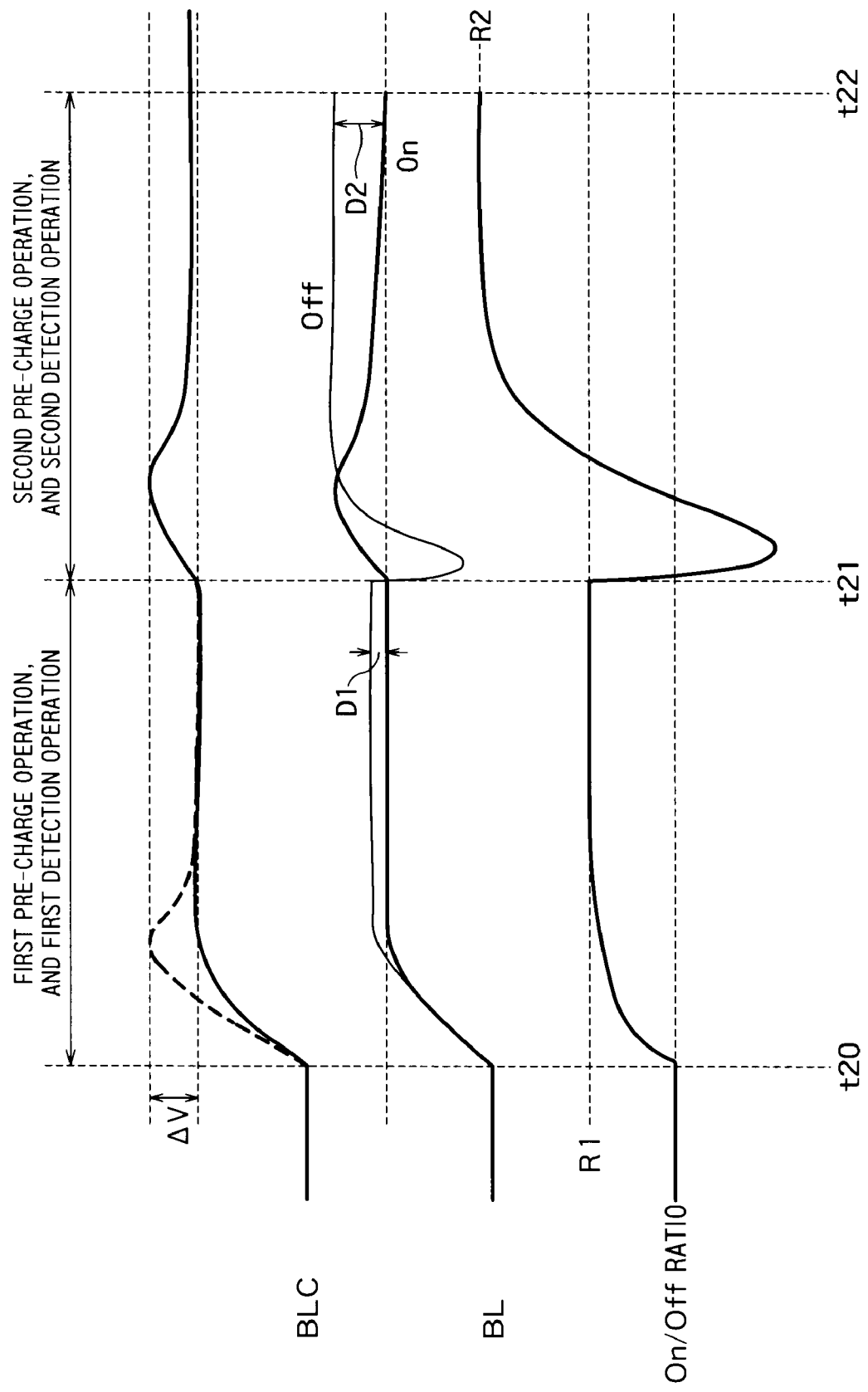
FIG. 10 is a timing diagram showing an operation of a sense module 180 in accordance with the fifth embodiment according to the present invention.

FIG. 10 is a timing diagram showing an operation of a sense module 180 in accordance with the fifth embodiment according to the present invention. FIG. 10 shows operations of the gate potential BLC of the transistor TN1 and a bit line potential BL, and an ON/OFF ratio in the pre-charge operation and the detection operation. The ON/OFF ratio is a ratio between a current (current flowing through TN1 shown in FIG. 7) supplied from a sense amplifier (referred to as S/A) connected to an ON cell and a current supplied from an S/A connected to an OFF cell. Operations of other signals of the fifth embodiment may be the same as that of the fourth embodiment.

First, a first pre-charge operation and a first detection operation in t20 to t21 are the same as those of the fourth embodiment.

Next, a bit line connected to a first ON cell detected as data "1" in the first pre-charge operation is reset to a potential VSS (grounding potential) in a second pre-charge operation. At this time, a potential of a bit line adjacent to the bit line reset to the potential VSS is largely lowered by capacitive coupling. In FIG. 10, at immediately after t21, a potential of a bit line BL connected to an OFF cell is largely lowered by capacitive coupling.

Furthermore, at immediately after starting the second pre-charge operation (t21), the gate potential BLC is set to be higher (over pre-charged) than that in the first detection operation. This allows the potential of the bit line BL connected to the OFF cell and a second ON cell to be charged to a higher level than that in the first detection operation. At a time of the completion of the second pre-charge operation, the gate potential BLC is returned to a potential equal to that in the first detection operation. This allows bit lines connected to cells other than the first ON cell to be a floating state of a high level potential. After that, the bit line potential connected to the OFF cell is maintained at a high level. The bit line potential connected to the second ON cell is gradually reduced, or to be a constant state at a low potential. Under such conditions, a second detection operation is executed.

As described above, the bit line potential difference and the ON/OFF ratio between the ON cell and the OFF cell during the detection operation can be increased by excessively pre-charging the bit line BL to be a high potential. For example, the bit line potential difference is D1 in the first detection operation where the bit line BL is not over pre-charged. However, the bit line potential difference is D2(>D1) in the second detection operation where the bit line BL is over pre-charged. As a result, the ON/OFF ratio in the first detection operation is R1, and the ON/OFF ratio in the second detection operation is R2 which is higher than R1.

In the fifth embodiment, only the second pre-charge operation and the second detection operation are over pre-charged. However, the first pre-charge operation and the first detection operation may also be over pre-charged.

Furthermore, the fifth embodiment can be applied to not only to the fourth embodiment but also to any one of the first to the third embodiments. In this case, the fifth embodiment can also have any one of the effect of the first to the third embodiments.

The invention claimed is:

1. A semiconductor storage device comprising:
a memory cell which stores data;
a bit line connected to the memory cell;
a first capacitor which supplies a charge to the memory cell;
a first sense node thorough which a potential corresponding to data of the memory cell is transmitted;
a first pre-charge part which is for charging the bit line, the first capacitor, and the first sense node;
a first latch part which latches the data of the memory cell;
a first sense part which includes a first sense transistor whose gate is connected to the first sense node, one of a source or a drain is connected to a power supply, and the other of them is connected to the first latch part; and
a first clamp part which allows a first node between the first latch part and the first sense transistor to be connected to the bit line,
wherein the first capacitor supplies the charge to the bit line during detecting the data of the memory cell, and the first sense part supplies a charge from the power supply to the bit line via the first clamp part in response a potential at the first sense node.

2. The semiconductor storage device according to claim 1, wherein the first clamp part is provided between the first node and the bit line, and includes a diode part which allows a current to be supplied from the first node to the bit line.

3. The semiconductor storage device according to claim 1, wherein the first clamp part includes a first transistor and a second transistor connected in series between the first sense node and the bit line; and
a diode part which is provided between the first node and a second node, and allows a current to be supplied from the first node to the second node, the second node being arranged between the first transistor and the second transistor.

4. The semiconductor storage device according to claim 1, wherein the first capacitor is connected to the first sense node, and supplies the charge to the bit line via the first sense node during detecting the data of the memory cell.

5. The semiconductor storage device according to claim 2, wherein the first capacitor is connected to the first sense node, and supplies the charge to the bit line via the first sense node during detecting the data of the memory cell.

6. The semiconductor storage device according to claim 3, wherein the first capacitor is connected to the first sense node, and supplies the charge to the bit line via the first sense node during detecting the data of the memory cell.

7. The semiconductor storage device according to claim 1, further comprising a replica module which includes: a second capacitor which supplies a charge to a constant current source; a second sense node through which a potential based on the constant current source is transmitted; a second pre-charge part which is for charging the second capacitor and the second sense node; a second latch part which latches the potential based on the constant current source; a second sense part which includes a second sense transistor whose gate is connected to the second sense node, one of a source or a drain is connected to a power supply, and the other of them is connected to the second latch part; a second clamp part which allows a replica node between the second latch part and the second sense transistor to be connected to the constant current source; and a strobe controller which outputs a strobe signal activated for only a predetermined period on the basis of a potential at the replica node and a potential latched by the second latch part, wherein
the replica module supplies the strobe signal for allowing a sense module to latch the data of the memory cell, the sense module including the first capacitor, the first sense node, the first pre-charge part, the first latch part, the first sense part, and the first clamp part.

8. The semiconductor storage device according to claim 2, further comprising a replica module which includes: a second capacitor which supplies a charge to a constant current source; a second sense node through which a potential based on the constant current source is transmitted; a second pre-charge part which is for charging the second capacitor and the second sense node; a second latch part which latches the potential based on the constant current source; a second sense part which includes a second sense transistor whose gate is connected to the second sense node, one of a source or a drain is connected to a power supply, and the other of them is connected to the second latch part; a second clamp part which allows a replica node between the second latch part and the second sense transistor to be connected to the constant current source; and a strobe controller which outputs a strobe signal activated for only a predetermined period on the basis of a potential at the replica node and a potential latched by the second latch part, wherein
the replica module supplies the strobe signal for allowing a sense module to latch the data of the memory cell, the sense module including the first capacitor, the first sense node, the first pre-charge part, the first latch part, the first sense part, and the first clamp part.

9. The semiconductor storage device according to claim 4, further comprising a replica module which includes: a second capacitor which supplies a charge to a constant current source; a second sense node through which a potential based on the constant current source is transmitted; a second pre-charge part which is for charging the second capacitor and the second sense node; a second latch part which latches the potential based on the constant current source; a second sense part which includes a second sense transistor whose gate is connected to the second sense node, one of a source or a drain is connected to a power supply, and the other of them is connected to the second latch part; a second clamp part which allows a replica node between the second latch part and the second sense transistor to be connected to the constant current source; and a strobe controller which outputs a strobe signal activated for only a predetermined period on the basis of a potential at the replica node and a potential latched by the second latch part, wherein
the replica module supplies the strobe signal for allowing a sense module to latch the data of the memory cell, the sense module including the first capacitor, the first sense node, the first pre-charge part, the first latch part, the first sense part, and the first clamp part.

10. The semiconductor storage device according to claim 1,
wherein the bit line, the first capacitor, and the first sense node are charged during pre-charging by a potential which is higher than a potential of the power supply connected to the first sense part.

11. The semiconductor storage device according to claim 3, wherein the first bit line, the first capacitor, and the first sense node are charged during pre-charging by a potential which is higher than a potential of the power supply connected to the first sense part.

12. The semiconductor storage device according to claim 8, wherein the bit line, the first capacitor, and the first sense node are charged during pre-charging by a potential which is higher than a potential of the power supply connected to the first sense part.

13. The semiconductor storage device according to claim 3, wherein the first capacitor is connected to the second node, and the first capacitor supplies the charge to the bit line via the second transistor during detecting the data of the memory cell.

14. The semiconductor storage device according to claim 9, wherein the first clamp part includes a first transistor and a second transistor connected in series between the first sense node and the bit line:

a diode part which is provided between the first node and a second node, and allows a current to be supplied from the first node to the second node, the second node being arranged between the first transistor and the second transistor;

the first capacitor is connected to the second node, and the first capacitor supplies the charge to the bit line via the second transistor during detecting the data of the memory cell.

15. The semiconductor storage device according to claim 11, wherein the first capacitor is connected to the second node, and the first capacitor supplies the charge to the bit line via the second transistor during detecting the data of the memory cell.

16. The semiconductor storage device according to claim 3, wherein the first transistor during pre-charging of the bit line, the first capacitor, and the first sense node has a gate potential which is higher than a gate potential of the first transistor during detecting the data of the memory cell.

17. The semiconductor storage device according to claim 9, wherein the first transistor during pre-charging of the bit line, the first capacitor, and the first sense node has a gate potential which is higher than a gate potential of the first transistor during detecting the data of the memory cell.

18. The semiconductor storage device according to claim 11, wherein the first transistor during pre-charging of the bit line, the first capacitor, and the first sense node has a gate potential which is higher than a gate potential of the first transistor during detecting the data of the memory cell.

19. The semiconductor storage device according to claim 13, wherein the first transistor during pre-charging of the bit line, the first capacitor, and the first sense node has a gate potential which is higher than a gate potential of the first transistor during detecting the data of the memory cell.

* * * * *